United States Patent
Kuenemund

(10) Patent No.: US 7,468,930 B2
(45) Date of Patent: Dec. 23, 2008

(54) APPARATUS AND METHOD FOR REDUCING THE LEAKAGE CURRENT OF MEMORY CELLS IN THE ENERGY-SAVING MODE

(75) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 11/686,509

(22) Filed: Mar. 15, 2007

(65) Prior Publication Data

US 2007/0217277 A1    Sep. 20, 2007

(30) Foreign Application Priority Data

Mar. 16, 2006  (DE) ................ 10 2006 012 187

(51) Int. Cl.
*G11C 5/14* (2006.01)
(52) U.S. Cl. ............ 365/227; 365/154; 365/189.011
(58) Field of Classification Search ............ 365/227, 365/154, 189.011, 203
See application file for complete search history.

(56) References Cited

U.S. PATENT DOCUMENTS

| | | | |
|---|---|---|---|
| 6,845,026 B1 | 1/2005 | Gharia | |
| 7,102,915 B2 * | 9/2006 | Sohn | 365/154 |
| 2005/0185448 A1 * | 8/2005 | Lin | 365/154 |

FOREIGN PATENT DOCUMENTS

WO    WO-2005/006340 A2    1/2005

OTHER PUBLICATIONS

R.W. Mann et al.; "Ultralow-power SRAM technology"; IBM J. Res & Dev., vol. 47, No. 5/6, Sep./Nov. 2003.

* cited by examiner

*Primary Examiner*—Anh Phung
*Assistant Examiner*—Toan Le
(74) *Attorney, Agent, or Firm*—Dickstein, Shapiro, LLP.

(57) ABSTRACT

The energy consumption of a static memory cell, which may be connected to a first bit line and a second bit line of a bit line pair by means of transistors, is reduced in an energy-saving mode of operation by adjusting the potentials on each of the bit lines of the bit line pair such that a potential difference between the gate terminals of the transistors and the bit lines of the bit line pair is reduced in comparison with a normal mode of operation.

9 Claims, 5 Drawing Sheets

APPARATUS AND METHOD FOR REDUCING THE LEAKAGE CURRENT OF MEMORY CELLS IN THE ENERGY-SAVING MODE

CROSS-REFERENCE TO RELATED APPLICATION

This application claims priority from German Patent Application No. 102006012187.2, which was filed on Mar. 16, 2006, and is incorporated herein by reference in its entirety.

TECHNICAL FIELD

The present invention concerns an apparatus and a method enabling reduction in energy consumption of memory cells in an energy-saving mode as opposed to the energy consumption in a normal mode of operation, and particularly for the reduction of the standby energy consumption of static memory cells.

BACKGROUND

In modern integrated circuits (ICs), such as in battery-operated mobile or contactless systems, such as mobile phones etc., there typically are modes of operation (standby or sleep mode) in which the integrated circuit is to consume as little energy as possible while maintaining minimum functionality. Here, typically no computation operations or other signal exchanges take place whatsoever within an IC, and the entire IC is only allowed to have a preset, minimum energy turnover, which is typically also fixed by specific norms. With increasing miniaturization, i.e. the advance toward nanometer technologies, this becomes more and more difficult because the number of the circuit elements, i.e. the potential causes of leakage currents, increases per individual IC on the one hand, and the transistor leakage currents rise considerably by the miniaturization on the other hand, which is routed in the physical properties of the materials used and is caused by the small structural size, in particular. The problem of the high transistor leakage currents particularly exists for modern "deep sub-micron" technologies, in which transistor channel lengths in the range of 100 nm and below, as well as gate oxide thicknesses of 2.5 nm and below are used. The transistor leakage current thus is that current consumed by a transistor when operated statically, i.e. does not change its state by switching, wherein the typical switching losses occur. The increasing miniaturization thus leads to increased current consumption already in an inactive state of a circuit, i.e. when no computation operations are performed in the circuit.

In the conventional art, there is a series of different approaches to reduce the energy consumption of ICs or processors in a so-called sleep mode, in which the ICs are completely or partially switched off, i.e. disconnected from supply voltage. In general, those parts of the IC the electric function of which is needed again only when the entire system leaves the sleep mode and resumes its normal mode of operation can be switched off. Examples for parts of an IC that can be switched off, for example, are subunits for the generation of control signals, the storing elements of which are allowed to loose their information in the sleep mode, since they may be automatically set (reset) to a certain initial state ensuring their function before resuming the normal operation. As an alternative to switching off, the supply voltage of such parts of the IC may be lowered considerably, so that memory elements still retain their information, for example, but it is no longer possible to perform switching operations, i.e. to switch transistors over (which also is not necessary in the sleep mode).

But there is a series of sub-circuits, for example of a CPU (central processing unit) of a system, the switch-off of which would entail a loss of information preventing operation of the system after ending the sleep mode. In addition, it is to be evaluated whether energy or time loss, which may be accompanied by switching off sub-circuits, is acceptable when ending the sleep mode and can thus be justified by the energy saved during the sleep mode. Parts of an IC or a CPU that typically cannot be switched off, i.e. the information of which also has to be maintained in the sleep mode, for example, are memory macros, such as SRAMs, caches and processor registers (register files) as well as parts of data paths (access memory addresses etc.). When switching off the active calculating unit of a CPU, this information has to be maintained, because the CPU strictly needs this information when ending the sleep mode (upon wake-up) to be able to resume the operation at the point at which the sleep mode was initiated. Overall, data that has to be maintained usually is instructions and data for the CPU, as well as intermediate results of the computations of the CPU and state registers.

Such information is usually stored in SRAM-based sub-circuits of the IC or the CPU, i.e. using memory technologies that maintain the content of a stored value themselves when the supply voltage is available, i.e. that do not always have to be refreshed again, like DRAM memories.

Such SRAM regions therefore must not be disconnected from the supply voltage and hence are to be electrically insulated, in the sleep mode, from those units that are disconnected from the supply voltage or the supply voltage of which is lowered.

The energy consumption of an IC in the sleep mode is typically dominated by the leakage currents of SRAM macros or SRAM cells or by circuit blocks, such as caches or register files based on SRAM technologies.

The principle construction of a typical SRAM cell is shown in FIG. 6.

The memory access to an SRAM cell here is done via a bit line pair of a first bit line 2a and a second bit line 2b. An SRAM cell 4 is formed by two inverters 6a and 6b, wherein the output of the inverter 6a is connected to the input of the inverter 6b, and wherein the output of the inverter 6b is connected to the input of the inverter 6a, as it can be seen in FIG. 6. A memory content, once impressed in the cell at circuit nodes 8a (b) and 8b (bq), thus is automatically maintained by the inverters 6a and 6b connected as described above. The inverters 6a and 6b are typically constructed by means of suitably connected NMOS and PMOS transistors, which also have to be supplied with a supply voltage. Here, the upper supply potential is typically referred to as VDD and the lower supply potential (ground) as VSS. Since the exact realization of the inverters as well as the external connection of the inverters by means of supply voltages is not relevant for the principle functioning of an SRAM cell, these two aspects of an SRAM cell are not illustrated in FIG. 6.

During the normal operation, i.e. when a value is stored in the SRAM cell, the circuit nodes 8a and 8b are at defined potentials, wherein different potentials each, namely VDD or VSS, are present at the circuit nodes 8a and 8b according to the connection of the inverters 6a and 6b. For example, if the circuit node 8a is at the potential VDD, the circuit node 8b is at the potential VSS. Moreover, in order to be able to change the memory content of the SRAM cell 4, the circuit node 8a is connected to the bit line 2a via a first NMOS transistor 10a in electrically conductive manner, and the second circuit node 8b can be connected to the bit line 2b via a second NMOS transistor 10b. The gate terminals of the transistors 10a and 10b are connected to a word line 12, so that, when applying a switch signal to the word line 12, the transistors 10a and 10b are switched to the conducting state, and the first circuit node 8a thus is connected to the bit line 2a, and the second circuit node 8b to the bit line 2b.

When writing content into the SRAM cell, at first the bit line 2a and the bit line 2b are brought to potentials corresponding to the bit value to be stored (for example VDD on the bit line 2a and VSS on the bit line 2b). Ensuing selecting of the SRAM cell 4 by applying a switching voltage to the word line 12 then writes the bit value into the memory cell 4 by bringing the first circuit node 8a to the potential of the first bit line 2a and the second circuit node 8b to the potential of the bit line 2b by making the conducting connection.

The process of reading substantially works in equivalent manner, but a so-called precharge is to be performed first to enable reading, i.e. the potentials of the bit lines 2a and 2b are to be brought to VDD, so that in the ensuing selection of the word line the potential of that bit line can be drawn to VSS, which is connected to the circuit node that is at VSS.

One possibility for the reduction of the loss power of an SRAM-based subcircuit may be to lower the supply voltage of the subcircuit, in order to reduce the leakage current of the individual transistors. Such lowering should, however, not become so large that the system of two inverters 6a and 6b can no longer maintain the memory state. Hence, the possibility of lowering the supply voltage is limited, so that the energy saving that can be attained is also limited.

The mechanisms leading to the spurious leakage currents of individual transistors or SRAM cells are being examined intensively. For example, in "Ultralow-power SRAM technology" (R. W. Mann et al., IBM J. RES. & DEV., volume 47, no. 5/6, September/November 2003), the mechanisms leading to the occurrence of leakage currents are described in detail. The so-called gate leakage, the diffusion leakage, the subthreshold leakage and the so-called gate-induced drain leakage (GIDL) have important shares in the overall loss power. In the momentary stage of the technological development, the subthreshold leakage and the GIDL, in particular, are relevant here, but the contribution of the gate leakage will be more and more important in the future with the further structural shrinkage to be expected (with "very deep submicron" technologies with channel lengths of clearly below 100 nm and gate oxide thicknesses below 2 nm).

The subthreshold leakage describes the flow of current arising through the transistors, when different electrical potentials are present at the source and drain terminals, even if a potential lying far below the actual switching voltage (threshold voltage Vt) is present at the gate terminal. The subthreshold leakage is strongly temperature dependent and therefore typically the dominant leakage current mechanism at higher temperatures.

The gate-induced drain leakage GIDL contributes to the leakage current in the geometric regions in which the gate region geometrically overlaps with the source region and/or the drain region within the transistor. The gate-induced drain leakage is caused by band-to-band tunneling of charge carriers (electrons) in the above-described overlapping regions. The band-to-band tunneling effect is enhanced if additional energy levels for the charge carrier become possible between the band due to contaminations and/or process fluctuations in the overlapping regions, because the leakage current is then additionally increased by the so-called trap-assisted band-to-band tunneling.

As described in the foregoing, an SRAM cell typically consists of six individual transistors, wherein a measure for the reduction of the SRAM leakage currents known in the conventional art consists in supplying the source terminals of the n-channel transistors of the six-transistor SRAM cells not with VSS (ground) in the sleep mode, but with a so-called "virtual VSS", i.e. a potential vVSS lying at about 0.5 V above VSS, while the p substrate of the n-channel transistors still remains connected to VSS. For example, this may be realized by VSS being shorted to vVSS via a conducting n-channel transistor in the normal operation (the control signal at the gate of this transistor is connected to VDD). In the sleep mode, however, the n-channel transistor mentioned is made non-conducting (the control signal at the gate of this transistor is connected to VSS). Via a further n-channel transistor that is connected as a diode and the drain and gate of which are connected to vVSS and the source of which to VSS, now vVSS may rise up to about a starting voltage $V_{th}$ above VSS (through leakage currents).

By this measure, however, substantially only the subthreshold current (subthreshold leakage) of n-channel transistors is reduced, because the starting voltage $V_{th}$ of these transistors is increased through the so-called substrate control effect, and because the subthreshold voltage depends on $V_{th}$ exponentially. But because the subthreshold current is strongly temperature dependent, as described above, this measure for lowering the current consumption of SRAM cells is only suited conditionally in standby, in which typically only low thermal loss power is generated, i.e. the ambient temperature is low.

In these cases, in which the gate-induced drain leakage has a relevant share of the overall leakage current for present technologies, the current consumption is positively influenced only in parts by this measure. The gate-induced drain leakage has a multiplicity of mechanisms contributing to the GIDL, such as the above-mentioned trap-assisted band-to-band tunneling effect. This, as well as other shares of the GIDL, have exponential dependence on the difference of the potentials at gate and drain/source or substrate of the respective transistor.

BRIEF DESCRIPTION OF THE DRAWINGS

Embodiments of the present invention will be detailed subsequently referring to the appended drawings, in which.

DETAILED DESCRIPTION

Figure 1:
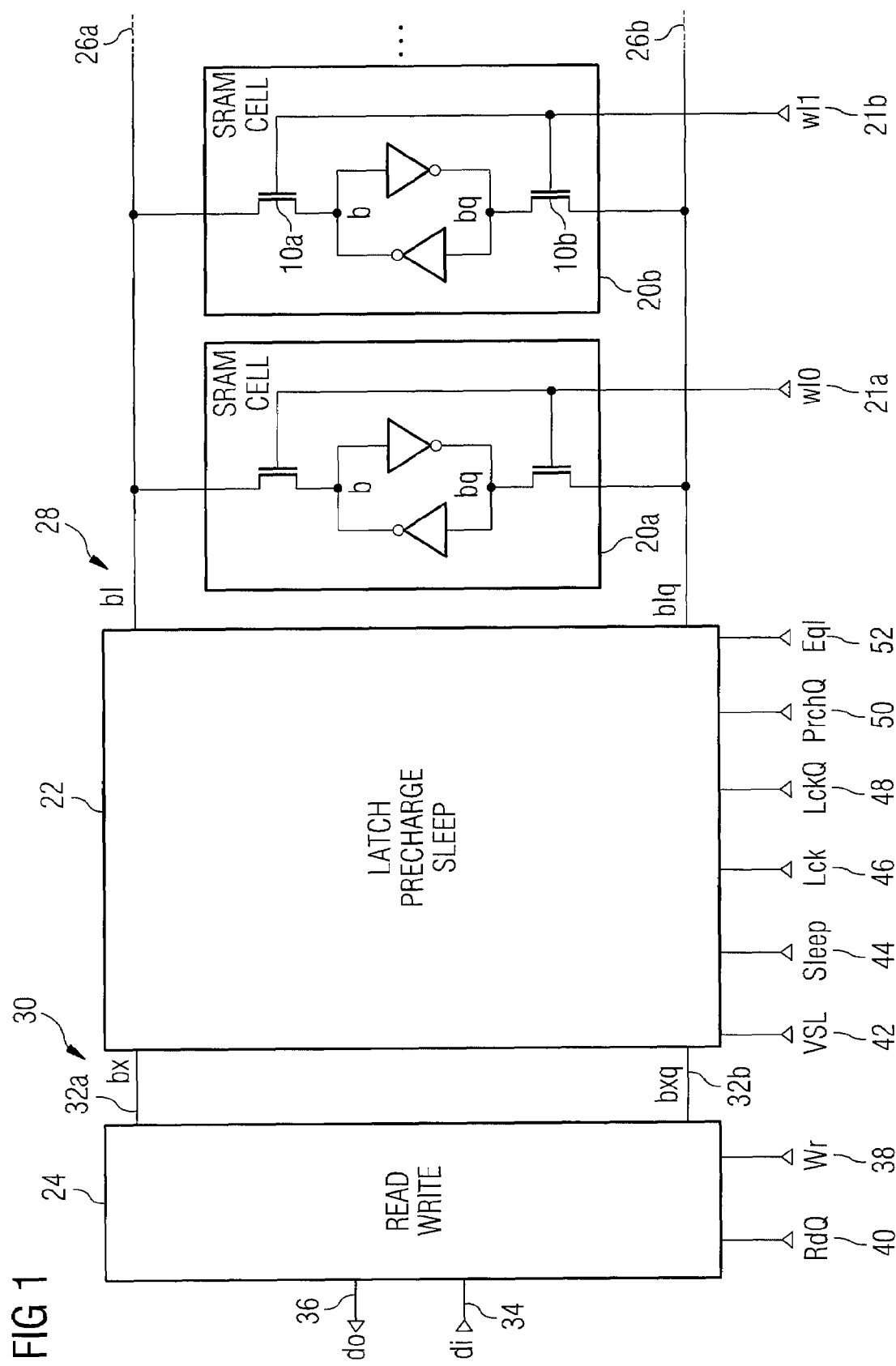
FIG. 1 shows an example for a system for controlling a static memory cell by means of a control apparatus according to the invention.

According to an embodiment, a control apparatus for controlling a static memory cell may have a first transistor with a source terminal connected to a first bit line of a bit line pair and a second transistor with a source terminal connected to a second bit line of the bit line pair, wherein the control apparatus is formed to adjust the potentials on each of the bit lines of the bit line pair in an energy-saving mode of operation such that a potential difference between a gate terminal and the source terminal of at least one transistor is smaller than in a normal mode of operation.

According to another embodiment, a method of controlling a static memory cell with a first transistor with a source terminal connected to a first bit line of a bit line pair and with a second transistor with a source terminal connected to a second bit line of the bit line pair, may have the step of: adjusting the potential on each of the bit lines of the bit line pair such that a potential difference between a gate terminal and the source terminal of at least one transistor in an energy-saving mode of operation is smaller than in a normal mode of operation.

The present invention is based on the finding that the energy consumption of a static memory cell, which can be connected to a first bit line and a second bit line of a bit line pair by means of transistors, can be reduced in an energy-saving mode of operation by adjusting the potentials on each of the bit lines of the bit line pair such that a potential difference between the gate terminals of the transistors and the bit lines of the bit line pair is reduced in comparison with a normal mode of operation.

In methods or apparatus corresponding to the conventional art, since the word lines (i.e. the gate terminals of the n-channel transistors connected to the bit lines) of SRAM cells are connected to VSS or vVSS in the sleep mode, while the bit lines, i.e. the drain/source terminals of these transistors are at the supply potential VDD, all these n-channel access transistors along the bit line have a high potential difference between drain/source and gate, as well as between drain/source and substrate, which leads to very high gate-induced drain leakage.

In an embodiment of the present invention, the potentials on each of the bit lines of a bit line pair, via which SRAM cells can be programmed and/or read out, are therefore adjusted in an energy-saving mode of operation such that the potential difference between the gate terminals of the n-channel access transistors along the bit lines becomes lower than in the normal state of operation. This has the great advantage that a multiplicity of transistors can simultaneously be placed into a state in which they consume less energy than previously, by a circuit-technologically simple extension of a circuit controlling the bit lines.

In a further embodiment of the present invention, inventively varying the potentials on each of the bit lines is achieved by connecting the bit lines of the bit line pair to each other in electrically conducting manner in the energy-saving mode of operation. By charge balance of the two bit lines of the bit line pair and by circuit losses, a potential lying between VSS and VDD thus develops on both bit lines (one of the bit lines was on VDD before the beginning of the sleep mode, the other one at VSS), so that the potential difference between the gate terminals of the access transistors and the bit lines is lowered, according to the invention, as opposed to a state in which both lines lie at VDD. The great advantage of this embodiment of the present invention is it can be implemented in especially easy and efficient manner in hardware in terms of circuit technology.

In a further embodiment of the present invention, the bit lines are switched to the virtual ground potential vVSS in the sleep mode, so that a voltage source for the provision of the virtual supply voltage vVSS, which is already present, may efficiently be used for providing the potentials for the supply of the bit lines in the sleep mode.

In a further embodiment of the present invention, a control circuit for controlling the bit lines of a bit line pair, which can bring both bit lines of the bit line pair to the high supply potential in a precharge mode and has the latch functionality, i.e. which keeps the last read-out data available at an output until the next read operation, is modified so that it also supports the inventive method of modifying the potentials of the bit lines in the sleep mode. This has the great advantage that, by means of less additional circuit elements, the current saving function can be integrated into an existing package for controlling the bit line pairs, so that the application of the inventive concept can also be realized easily on already existing designs, without compromising the original functionality.

FIG. 1 shows a system for controlling several SRAM memory cells 20a and 20b, which includes a control apparatus 22 and an input/output device 24.

Bit lines 26a and 26b of a bit line pair are connected to a memory-side bit terminal 28 of the control apparatus 22, which additionally comprises a system-side bit terminal 30 connecting system-side bit lines 32a and 32b to the input/output device 24.

The input/output device 24 comprises a data input 34 for receiving bit values to be written, as well as a data output 36 for outputting read bit values. Moreover, the input/output device 24 comprises a write control input 38 and a read control input 40.

The control apparatus 22 comprises an auxiliary voltage input 42, an energy mode input 44 (sleep), a first control signal input 46, a second control signal input 48, a precharge input 50, and a shorting control input 52.

As already described, by means of an inventive control circuit, it is possible to adjust the bit line pairs of SRAM memories and/or the potential on each of the bit lines such that both bit lines are conductingly connected to either
- ground potential VSS, or
- "virtual ground" vVSS, or
- a suitable other potential lying between VDD and VSS in the sleep mode, or that the two bit lines of each bit line pair are connected to each other in the sleep mode, without the bit lines being connected to any potential in conducting manner.

By each of these measures, it is achieved that, for the (access) transistors in SRAM cells having their drain/source terminal connected to a bit line, the difference of the potentials at drain/source and gate and/or drain/source and substrate relevant for the GIDL is reduced, which results in a significantly lower GIDL of these transistors.

Conventional six-transistor SRAM cells along the bit line pair of bit lines 26a and 26b (bl, blq) and/or their cell nodes b and bq can be conductingly connected to the bit line pair of bit line 26a (bl) and 26b (blq) via n-channel transistors 10a and 10b by their gate terminals connected to the word lines wl0, wl1, ..., if the high supply potential VDD is present at wl0 and/or wl1. But the circuit nodes b and bq may be insulated from the bit lines 26a and 26b if the low supply potential VSS is present at the word lines wl0 and wl1.

For the system shown in FIG. 1, it is possible, by means of an inventive control apparatus 22, to control the static memory cells 20a and 20b such that, in an energy-saving mode of operation, the potential of each of the bit lines 26a and 26b of the bit line pair can be adjusted so that the potential difference between the gate terminal (the word lines wl0 and wl1) and the source terminal of the transistors 10a and 10b is smaller than in a normal mode of operation.

So as to make the functioning of the inventive control apparatus 22 in the system clearer, the entire system, and particularly the control apparatus 22, will be explained in greater detail in the following with reference to FIGS. 2-4. In the following figures, in particular, identical components are provided with the same reference numerals, so that the description of the components concerned in the different drawings is each applicable to each other mutually and logically.

Figure 2:
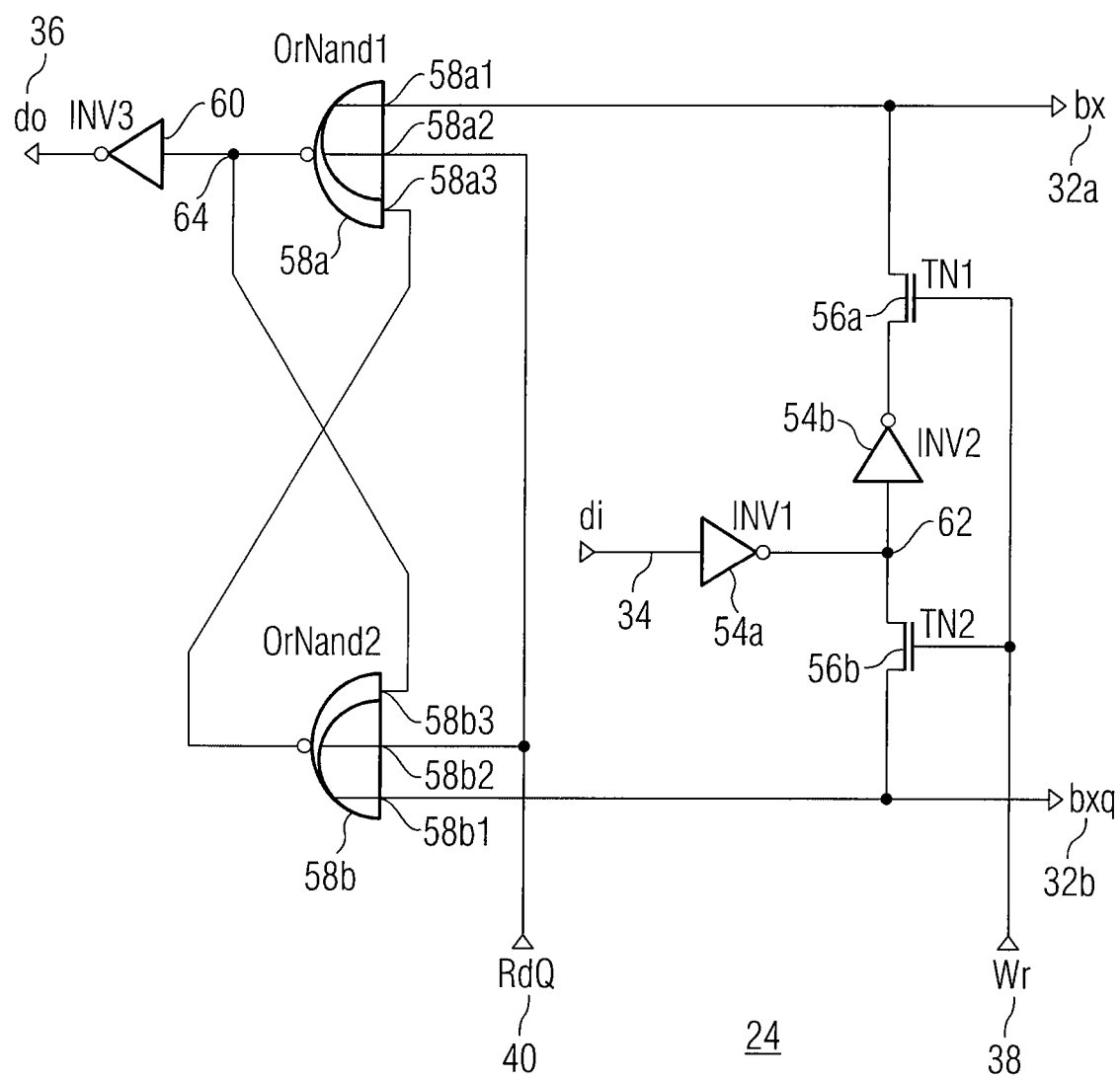
FIG. 2 shows an example for an input/output means of the system of FIG. 1.

First, FIG. 2 shows an embodiment of an inventive input/output device 24 with the inputs and outputs already described on the basis of FIG. 1.

The input/output device 24 comprises a first inverter 54a, a second inverter 54b, a first transistor 56a and a second transistor 56b, a first logic gate 58a and a second logic gate 58b, as well as an output inverter 60. In the following explanations, for simplification of the description, from now on the state that a circuit node and/or a line lies at the supply potential will be used synonymously with the formulation that at this point a logic "1" or the "high" potential is present.

In the embodiment of the input/output device 24, the data bit input 34 is connected to the input of the inverter 54a, the data output of which is connected to a first circuit node 62. The second transistor 56b is connected to the first circuit node 62 at its first source/drain terminal and to the second bit line 32b at its second source/drain terminal. The second inverter 54b is connected to the first circuit node 62 at its input and, its data output, to a first source/drain terminal of the first transistor 56a, the second source/drain terminal of which is connected to the first bit line 32a. The gate terminals of the transistor 56a and 56b are connected to each other on the one hand and to the write control input 38 on the other hand. The data output 36 is connected to the output of the output inverter 60, the input of which is connected to a second circuit node 64.

The logic gates 58a and 58b are OrNand gates, each comprising three data inputs. The first logic gate 58a has the data inputs 58a1, 58a2 and 58a3, the second logic gate 58b has the data inputs 58b1, 58b2 and 58b3 in equivalent manner thereto. Internally, at first the signals present at the data inputs 58a1 and 58a2 and/or 58b1 and 58b2 are subjected to ORing in the logic gates, whereupon the signal resulting from this ORing is NANDed with the signal present at the data input 58a3 and/or 58b3. The result of this operation is in turn presented at the data output of the logic gates 58a and 58b.

The system-side bit line 32a is connected to the first data input 58a1 of the logic gate 58, the second data input 58a2 of which is connected both to the second data input 58b2 of the second logic gate 58b and to the read control input 40. The first data input 58b1 of the second logic gate 58b is connected to the second system-side bit line 32b. The data output of the first logic gate 58a is connected, via the second circuit node 64, both to the data input of the output inverter 60 and to the third data input 58b3 of the second logic gate 58b, the data output of which is connected to the third data input 58a3 of the first logic gate 58a. In this feedback connection, the first and the second logic gates form a so-called RS latch.

If the supply potential VDD is present at the write control input 38 (WR), the transistors 56a and 56b are conducting, so that a "0" (i.e. low supply potential VSS) at the data input 34 is transferred to the first system-side bit line 32a via the first inverter 54a, the second inverter 54b and the first transistor 56a, while the potential VDD–VTN is transferred to the second system-side bit line 32b via the first inverter 54a and the second transistor 56b, because an n-channel starting voltage VTN drops across the second transistor-56b. In analog manner, a logic 1 (i.e. VDD) at the data input 34 is transferred to the second system-side bit line 32b via the first inverter 54a and the second transistor 56b, while the potential VDD–VTN is transferred to the first system-side bit line 32a via the first inverter 54a, the second inverter 54b and the first transistor 56a, because an n-channel starting voltage VTN also drops across the first transistor 56a.

If the low supply potential VSS is present at the write control input 38, the transistors 56a and 56b are blocked, so that no connection from the data input 34 to the system-side bit lines 32a and 32b exists, i.e. writing is impossible. The writing apparatus is also deactivated then.

The first logic gate 58a and the second logic gate 58b, as well as the output inverter 60, in the connection shown in FIG. 2, enable to transmit data and/or voltage states present on the system-side bit lines 32a and 32b to the data output 36 so that the last read data from the data output 36 each is maintained in unchanged manner, so that no unnecessary state changes, so-called dynamic hazards, not caused by a read operation, can occur. The RS latch formed of the logic gates 58a and 58b is activated when the value VSS, i.e. the low supply potential, is present at the read control input 40 (RdQ), and when a valid datum lies on the system-side bit lines 32a and 32b. A valid datum is defined by the fact that one of the system-side bit lines 32a or 32b is at a high potential and the respective other one at a low potential, a state that can also be represented as (0,1) or (1,0). A precharge state (1,1) needed for reading data causes the value read in the preceding read operation still to be present at the data output 36. The state (0,0) never can occur in the normal operation, but for example be effected by an attack with ionizing radiation. Then, this forces the irrelevant value 0 at the data output 34 if the read control input 40 lies at the potential VSS at the same time. At the transition from (1,1) to (0,1) or to (1,0), the RS latch is switched on via the data inputs 58a1 and 58b1 if the read control input 40 has been set to VSS before. By means of the input/output device 24, unique bit values may be impressed on the system-side bit lines 32a and/or 32b in complementary form, and/or unique bit values may be read from the bit lines 32a and 32b and made available at a data output 36 in non-complementary form.

Figure 3:
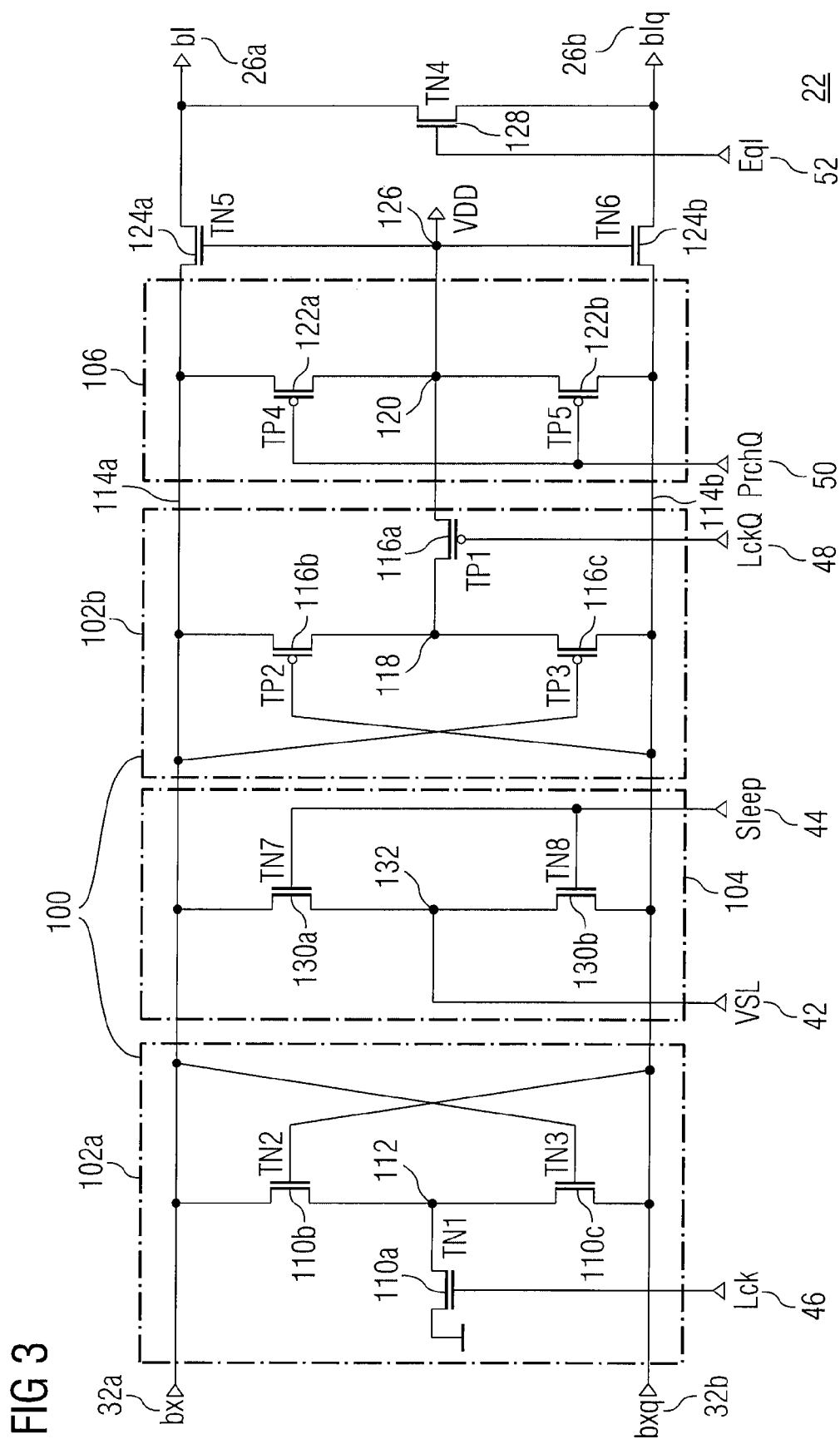
FIG. 3 shows an example for a control apparatus according to the invention.

FIG. 3 shows an embodiment of an inventive control apparatus 22, as it was already introduced as a functional unit on the basis of FIG. 1.

Here, the inventive control apparatus comprises three functionalities. On the one hand, it enables the precharge of the bit lines 26a and 26b, which is needed for a read cycle from an SRAM memory cell. Moreover, a latch functionality is achieved with the control apparatus, i.e. a datum read or written onto the bit lines before is maintained until renewed access takes place. Moreover, according to the invention, the control apparatus is capable of adjusting the potential on each of the bit lines of the bit line pair consisting of the bit lines 26a and 26b so that the potential difference between the gate terminals of the access transistors of the memory cell and the bit lines 26a and 26b is reduced during an energy-saving mode of operation (sleep).

The various functionalities are realized by means of suitably connected transistors, wherein a latch transistor group 100 consisting of an n-channel latch group 102a and a p-channel latch group 102b is shown in FIG. 3. The sleep functionality is realized by means of a sleep unit 104, and the precharge functionality by a precharge unit 106.

The n-channel latch group 102a includes a first n-channel transistor 110a, a second n-channel transistor 110b and a third n-channel transistor 110c. The first n-channel transistor 110a is connected to the potential VSS at a first source/drain terminal and to a first circuit node 112 at a second source/drain terminal. The second n-channel transistor is connected to a first bit line 114a at a first source/drain terminal and to the first circuit node 112 at a second source/drain terminal. The third n-channel transistor 110c is connected to a second bit line 114b at a first source/drain terminal and to the first circuit node 112 at a second source/drain terminal. The gate terminal of the second n-channel transistor 110b is connected to the second bit line 114b, and the gate terminal of the third n-channel transistor 110c is connected to the first bit line 114a. The p-channel latch group 102b includes a first p-channel transistor 116a, a second p-channel transistor 116b and a third p-channel transistor 116c.

The first p-channel transistor 116a is connected to a second circuit node 118 at a first source/drain terminal and to a third circuit node 120 at a second source/drain terminal. The second p-channel transistor 116b is connected to the first bit line 114a at a first source/drain terminal and to the second circuit node 118 at a second source/drain terminal. The third p-channel transistor 116c is connected to the second bit line 114b at a first source/drain terminal and to the second circuit node 118 at a second source/drain terminal. The gate terminal of the second p-channel transistor 116b is connected to the second bit line 114b, and the gate terminal of the third p-channel transistor 116c is connected to the first bit line 114a. The gate terminal of the first p-channel transistor 116a is connected to the second control signal input 48.

The precharge unit 106 consists of a fourth p-channel transistor 122a and a fifth p-channel transistor 122b. The fourth p-channel transistor 122a is connected to the first bit line 114a at a first source/drain terminal and to the third circuit node 120 at a second source/drain terminal. The fifth p-channel transistor 122b is connected to the second bit line 114b at a first source/drain terminal and to the third circuit node 120 at a second source/drain terminal. The gate terminals of the fourth and fifth p-channel transistors 122a and 122b are commonly connected to the precharge input 50. N-channel transistors 124a and 124 are connected between the precharge unit 106 and the memory-cell-side bit line output, i.e. the connection to the bit lines 26a and 26b, wherein the n-channel transistor 124a is connected to the bit line 114a at a first source/drain terminal and to the bit line 26a at a second source/drain terminal. In equivalent manner hereto, the n-channel transistor 124b is connected to the bit line 114b at a first source/drain terminal and to the bit line 26b at a second source/drain terminal. The gate terminals of the n-channel transistors 124a and 124b are commonly connected to the supply potential VDD via a fourth circuit node 126, wherein the fourth circuit node 126 is additionally connected to the third circuit node 120. The bit lines 26a and 26b are each connected to a source/drain terminal of a shorting transistor 128, the gate terminal of which is connected to the shorting control input 52.

The sleep unit 104 consists of a seventh n-channel transistor 130a and an eighth n-channel transistor 130b. The seventh n-channel transistor 130a is connected to the first bit line 114a at a first source/drain terminal and to a fifth circuit node 132 at a second source/drain terminal. The eighth n-channel transistor 130b is connected to the second bit line 114b at a first source/drain terminal and to the fifth circuit node 132 at a second source/drain terminal. The fifth circuit node 132 is additionally connected to the auxiliary voltage input 42. The gate terminals of the seventh and eighth n-channel transistors 130a and 130b are commonly connected to the energy mode input 44.

In the following, on the basis of the inventive control apparatus 22, it is to be described how the latch functionality is realized, i.e. how it can be achieved that the datum lying on the bit lines can be maintained until the ensuing access after a read or write operation. This functionality is realized by the n-channel latch group 102a and the p-channel latch group 102b. If the first control signal 46 assumes the value VDD, the first circuit node 112 is connected to VSS, the first control signal 46 is at the potential VSS, the first circuit node 112 is disconnected from VSS. In equivalent manner thereto, the third circuit node 118 is connected to VDD by applying VSS to the second control signal input 48 and disconnected therefrom by applying the potential VDD. By the second n-channel transistor 10b and the third n-channel transistor 10c, as well as by the second p-channel transistor 116b and the third p-channel transistor 116c, a feedback function between the first bit line 114a and the second bit line 114b is achieved, which corresponds to a memory function if VDD is present at the first control signal input 46 and at the same time VSS at the second control signal input 48. For this reason, the latch functionality is realized by the bit line pair of bit lines 114a and 114b itself in this configuration, which maintains the configuration of the last read or written data, i.e. remains either in the state (0,1) or in the state (1,0) between two accesses to a memory cell.

The precharge functionality, i.e. the fact that the first bit line 114a and the second bit line 114b are brought to VDD simultaneously prior to a read access, is realized by means of the fourth p-channel transistor 122a and the fifth p-channel transistor 122b. If the precharge input assumes the value VSS, the first bit line 114a is conductingly connected to the second bit line 114b via the fourth n-channel transistor 122a and the fifth n-channel transistor 122b. Likewise, if VDD is present at the shorting control input 52, the first bit line 26a is conductingly connected to the second bit line 26b, which on the one hand may accelerate the precharge operation, because a charge balance between the first bit line 26a and the second bit line 26b may take place, and on the other hand contributes to the fact that at the end of a phase of the precharge both bit lines are in good approximation on equal potential, even if the starting voltages of the n-channel transistors 124a and 124b, which connect the bit line 114a to the bit line 26a and the bit line 114b to the bit line 26b, deviate from each other.

The n-channel transistors 124a and 124b just mentioned, which make the connection between the bit lines 114a and 26a and the bit lines 114b and 26b, provide for the bit lines 26a and 26b being precharged only to VDD−VTN, because an n-channel starting voltage VTN each drops across the n-channel transistors 124a and 124b. Thereby, less charge and hence less energy are converted on the first bit line 26a and on the second bit line 26b, which also results in shorter access times.

The energy-saving mode of operation (sleep) can be realized in various ways according to the invention. On the one hand, this is possible by means of the seventh n-channel transistor 130a and the eighth n-channel transistor 130b, the gate terminals of which are connected to the energy mode input 44. If VDD is applied at the energy mode input 44, the bit lines 114a and 114b are brought to the potential present at the auxiliary voltage input 42. This may either be VSS or vVSS or any other suitable potential lying between VSS and VDD.

As an alternative thereto, the sleep mode can be activated by means of the shorting control input 52 if VDD is present at the shorting control input 52, so that the first bit line 26a is connected to the second bit line 26b by the shorting transistor 128, while VDD is present at the precharge input 50.

By the short of the first bit line 26a to the second bit line 26b, a charge exchange between the first bit line 26a and the second bit line 26b takes place, and a potential lying between VDD and VSS develops due to leakage currents on the first bit line 26a and the second bit line 26b.

Thus, according to the invention, the leakage current of an SRAM cell can be reduced in the sleep mode. By the inventive control apparatus 22, the high current in the sleep mode is reduced extraordinarily, because the GIDL proportion of the leakage current of a transistor has exponential dependence on the potential difference between gate and source of the transistors concerned, and the potential difference between gate and source of the access transistors of the SRAM memory cells can be reduced strongly or made zero according to the invention.

By the inventive control apparatus, bit lines 26a and 26b of a bit line pair can be conductingly connected either to
ground potential VSS, or
virtual ground vVSS, or
a suitable other potential lying between VDD and VSS in the sleep mode, or the two bit lines of each bit line pair are connected to each other in the sleep mode, without conductingly connecting the bit lines to any fixed potential.

Figure 4:
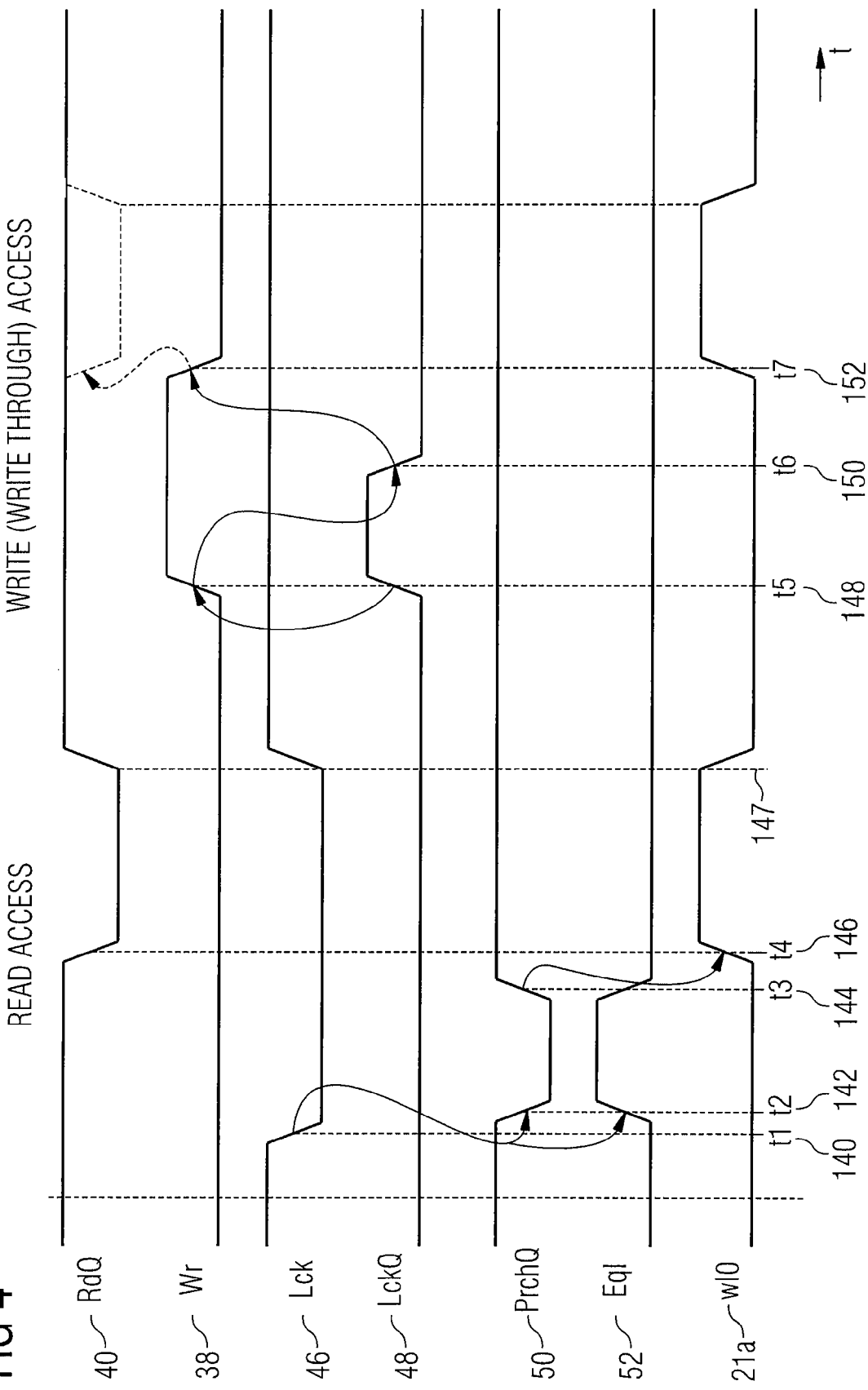
FIG. 4 shows an example for a timing diagram for inventively operating the system of FIG. 1.

On the basis of FIG. 4, it is now to be explained what a timing, i.e. a temporally defined sequence of control signals, may look like, in order to operate the inventive control apparatus 22 so that SRAM cells consume less energy in the sleep mode.

On the basis of FIG. 4, the time sequence of control signals, as they are needed in a write or a read access to a SRAM memory cell by means of the inventive control apparatus 22, is illustrated here.

FIG. 4 shows the time in arbitrary units on the x axis, and the voltage states or potentials at the input of the input/output device 24 and a control apparatus 22 according to the invention on the y axis. From top to bottom, the signals at the read control input 40, at the write control input 38, at the first control signal input 46, at the second control signal input 48, at the precharge input 50 and at the shorting control input 52 are illustrated. In addition, the waveform at the word line input 21a (w10) of an SRAM cell to which the memory or the read access is to be made is illustrated.

Two potential states are possible for each individual control signal. If the potential is on an upper level, the potential VDD is present at the input concerned, if the control potential is on a lower level, VSS correspondingly is present at the control input considered.

For a read access, at first the first control signal input 46 is set to VSS (low) from VDD (high) at the time instant 140 (t1), in order to prevent charge from flowing off via the n-channel transistors 110a-110c, when the precharge input is set to low from high at the time instant 142 (t2) and at the same time the shorting control input 52 from low to high to initiate the precharge phase. The precharge is finished at the time instant 144 (t3), where it is to be noted that a finite time is needed to bring the two bit lines 114a and 114b of the bit line pair to the high supply potential.

The precharge phase ends at the time instant 144, at which the precharge input 50 is again set to high, and the shorting control input 52 to low. At his time instant, both bit lines 26a and 26b are at the potential VDD–VTN, so that, when the first word line input 21a is set to a high potential at a time instant 146 (t4), one of the bit lines 26a or 26b connected to the node of the SRAM cell lying at low potential is drawn to a low potential. Thereby, the cell content of the SRAM cell is copied to the bit lines 26a and 26b. Moreover, at about the time instant 146, the read control input 40 of the input/output device 24 is set to a low potential, in order to provide the data present on the bit lines 26a and 26b, and hence also on the bit lines 114a and 114b, at the data output 36. The read cycle ends at the time instant 147 by approximately simultaneous deactivation of the read control input 40, the first control signal input 46 and the first word line 21a, so that the datum just read (potential states at the circuit nodes of the SRAM cell) is retained in the so-called "latch", i.e. on the bit lines.

In the write access, at first the second control signal input 48 is deactivated at a time instant 148 (t5), i.e. raised to VDD from VSS, in order to prevent charge from flowing off through the p-channel transistors 116a-116c during the ensuing write operation. Immediately afterwards or at the same time, by activating the write control input 38, the write operation is initiated, wherein one of the bit lines 26a is brought to VSS, and the respective other bit line to potential (VDD–VTN), as already described. This may be done at extremely high speed (within fractions of a nanosecond for modern technologies of less than 0.25 μm structural size). At a time instant 150 (t6), which follows shortly after the time instant 148, the second control signal input 48 may already be activated again, i.e. switched to VSS, whereby a node that may lie at the potential VDD–VTN, i.e. one of the bit lines 114a or 114b, is raised to the full level VDD. At a time instant 152 (t7), the write control input 38 may now be deactivated again, because the written datum is already stored on the bit lines 114a and 114b. If the first word line 21a is activated at about the same time as the time instant 152, i.e. raised to VDD, the stored datum is written into the corresponding SRAM cell.

As hinted at in FIG. 4, if the read control input 40 were activated at the same time, i.e. lowered to VSS, the stored datum may also be output on the data output 36, that is a so-called "write through" from the data input 34 to the data output 36 be realized. The end of a write operation is achieved with deactivating the first word line 21a by lowering to VSS from VDD.

According to the invention, all functionalities necessary for the normal operation of an SRAM cell may be combined with an inventive sleep mode, so that the full functionality is maintained in the normal operation, and so that the SRAM cells operated by an inventive control apparatus have only extremely low energy consumption in the sleep mode. This results from the fact that the leakage current is minimized by the access transistors, i.e. those transistors the gate terminals of which are connected to word lines 21a and 21b.

Figure 5:
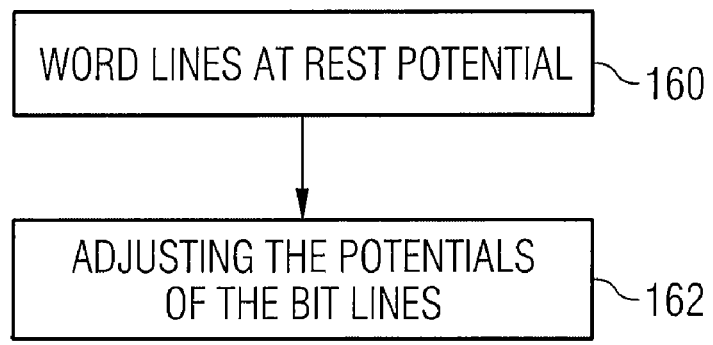
FIG. 5 is a flowchart for an example for inventively operating a memory cell.
Figure 6:
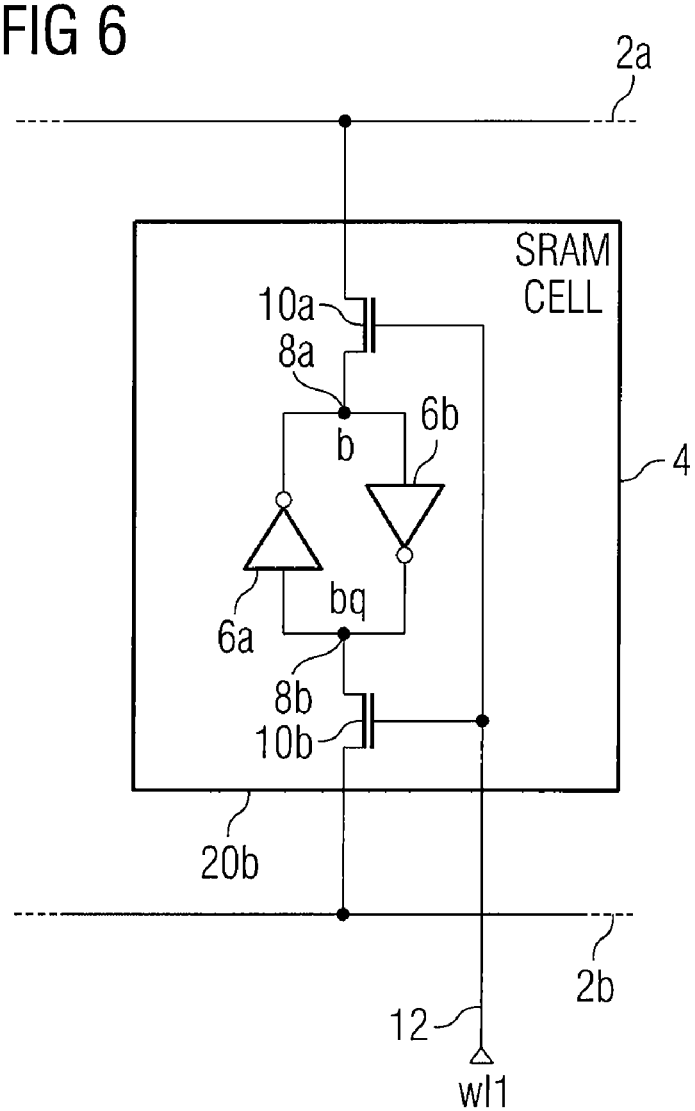
FIG. 6 shows an example for a static memory cell.

On the basis of FIG. 5, the sequence of steps necessary to apply the inventive concept for controlling memory cells so that the memory cells only consume little energy in the energy-saving mode of operation will be described once again the following.

In the preparation step 160, at first all SRAM cells are deselected, i.e. the word lines of the SRAM cells are controlled such that the cells are not selected.

In the ensuring control step 162, the potentials of the bit lines are adjusted such that the potential difference between the bit lines and the access transistors, which are controlled via the word lines so that individual cells can be selected, is so small that the SRAM cell has reduced loss power caused by the access transistors in the energy-saving mode of operation.

Although the access transistors are basically illustrated as NMOS FETs in the previous embodiments, so that their gates lie at VSS or at vVSS in the standby mode, and the potentials of the bit lines therefore have to lie below the supply potential VDD in the energy-saving mode of operation, in order to realize the inventive concept, this constellation for implementing the inventive concept is not necessarily needed. As an alternative, any other voltage states enabling to minimize a potential difference and a leakage current caused thereby by selection transistors could be adjusted. For example, if PMOS transistors are used as selection transistors, according to the invention, the potentials on the bit lines would be increased in the standby mode in order to minimize the energy consumption in the standby mode.

The embodiments described on the basis of the figures are to be understood as merely exemplary, in particular the functionality of the "latch", the precharge, and the sleep mode described on the basis of FIG. 3 may also be implemented in different discrete devices. Thereby, if the inventive energy-saving mode of operation is realized by means of a discrete independent device having two bit line terminals, for example, an existing circuit design may be extended in extremely simple and efficient manner by means of the new inventive energy-saving mode of operation.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A control apparatus for controlling a static memory cell with a first transistor with a source terminal connected to a first bit line of a bit line pair and with a second transistor with a source terminal connected to a second bit line of the bit line pair, wherein the control apparatus is formed to adjust the potentials on each of the bit lines of the bit line pair in an energy-saving mode of operation such that a potential difference between a gate terminal and the source terminal of at least one of the transistors is smaller than in a normal mode of operation.

2. The control apparatus of claim 1, wherein the control apparatus is formed to connect the bit lines of the bit line pair to each other in an electrically conducting manner in the energy-saving mode of operation.

3. The control apparatus of claim 1, wherein the control apparatus is formed to adjust the potentials on each of the bit lines of the bit line pair at a gate terminal of the first and second transistors lying at a lower supply potential such that the potentials substantially correspond to the lower supply potential.

4. The control apparatus of claim 1, wherein the control apparatus is formed to adjust the potentials of the bit lines of the bit line pair at a gate terminal of the first and second transistors lying at a lower supply potential in the energy-saving mode of operation such that they are at a predetermined intermediate potential between the lower supply potential and an upper supply potential.

5. The control apparatus of claim 1, wherein the control apparatus is formed to adjust the potentials on each of the bit lines of the bit line pair in a precharge mode of operation such that they substantially correspond to an upper supply potential.

6. The control apparatus of claim 1, wherein the control apparatus is formed such that a memory potential at a data output read out from a static memory cell or written into the static memory cell in a first read or write operation is maintained in unchanged manner at the data output until a second read or write operation following the first read or write operation.

7. A method of controlling a static memory cell with a first transistor with a source terminal connected to a first bit line of a bit line pair and with a second transistor with a source terminal connected to a second bit line of the bit line pair, comprising:

adjusting the potential on each of the bit lines of the bit line pair such that a potential difference between a gate terminal and the source terminal of at least one of the transistors in an energy-saving mode of operation is smaller than in a normal mode of operation.

8. A system for controlling a static memory cell having a first transistor with a source terminal connected to a first bit line of a bit line pair and a second transistor with a source terminal connected to a second bit line of the bit line pair, the system comprising:

an input/output device for receiving bit values to be written to the static memory cell and for outputting bit values read from the static memory cell; and a control apparatus configured to control the static memory cell by adjusting the potentials on each of the bit lines of the bit line pair in an energy-saving mode of operation such that a potential difference between a gate terminal and the source terminal of at least one of the transistors is smaller than in a normal mode of operation.

9. A system for controlling a static memory cell having a first transistor with a source terminal connected to a first bit line of a bit line pair and a second transistor with a source terminal connected to a second bit line of the bit line pair, the system comprising:

an input/output means for receiving bit values to be written to the static memory cell and for outputting bit values read from the static memory cell; and a control means for controlling the static memory cell by adjusting the potentials on each of the bit lines of the bit line pair in an energy-saving mode of operation such that a potential difference between a gate terminal and the source terminal of at least one of the transistors is smaller than in a normal mode of operation.

* * * * *